*INVENTOR.*
HAROLD FLEISHER
*BY*
P. E. Henninger

Sept. 8, 1959 H. FLEISHER 2,903,602

TRANSISTOR SWITCHING CIRCUITS

Filed Oct. 29, 1953 6 Sheets-Sheet 2

INVENTOR.
HAROLD FLEISHER

BY P. E. Henninger

Sept. 8, 1959 H. FLEISHER 2,903,602

TRANSISTOR SWITCHING CIRCUITS

Filed Oct. 29, 1953 6 Sheets-Sheet 3

INVENTOR.
HAROLD FLEISHER

BY P. E. Henninger

INVENTOR
HAROLD FLEISHER
BY P. E. Henninger
ATTORNEY

INVENTOR
HAROLD FLEISHER
BY P. E. Henninger
ATTORNEY

*INVENTOR.*
HAROLD FLEISHER

*BY*
P. E. Henninger

United States Patent Office 2,903,602

Patented Sept. 8, 1959

2,903,602

TRANSISTOR SWITCHING CIRCUITS

Harold Fleisher, Poughkeepsie, N.Y., assignor to International Business Machines Corporation, New York, N.Y., a corporation of New York Application October 29, 1953, Serial No. 389,115

8 Claims. (Cl. 307—88.5)

This invention relates to electric circuits and particularly to so-called switching circuits of the types known as logical and regenerative circuits. A particular feature of the invention is the employment of transistors in such circuits, but certain features of the invention are not necessarily limited to circuits employing transistors.

There has come into wide use in recent years a type of electrical circuit commonly called a logical circuit. A logical circuit may be defined as a circuit having a plurality of inputs and a single output, which responds, upon the receipt of signals at only a certain distinctive combination or combinations of the inputs to produce a signal at its output. Signals of other combinations of the inputs produce no effect at the output. When the several inputs are controlled by separate conditions, such circuits provide a means for logical discrimination among the combinations of conditions.

While logical circuits may be used to advantage in many situations, they have been used extensively in high-speed computers. The input signals for such circuits are commonly of the pulse type, i.e., the input current or potential shifts substantially instantaneously between two separated values.

One specific type of logical circuit has come to be known as an Or circuit. In such a circuit, which would be more accurately described as an And/Or circuit, an output pulse is produced whenever an input pulse is received at any of the inputs or at a plurality of inputs simultaneously.

Another type of logical circuit is known as an And circuit. Such a circuit produces an output pulse only when input pulses are received at all the inputs simultaneously.

A third type of logical circuit is known as an Exclusive Or circuit. This circuit produces an output pulse whenever an input pulse is received at any single one of its inputs, but not when input pulses are received simultaneously at a plurality of inputs.

It is well known and understood in the art that there is no structural difference between an And circuit and an Or circuit. The difference lies only in the significance which is arbitrarily attached to the several input signals and to the output signal. This situation with respect to the structural equivalence of the And and Or circuits will be explained more completely in connection with one of the specific circuits described below.

Another type of circuit which has come into wide use, is known as a "trigger" circuit, or as a "regenerative switching" circuit. In such a circuit, one predetermined input signal or combination of input signals initiates a certain condition as to current or potential at the circuit output, and the circuit maintains that condition until a different predetermined input signal or combination of signals is received. Commonly, such a circuit has only two stable output states and it is shifted back and forth between its two states in response to the input signals.

A common form of regenerative circuit has a single input and single output, and is known as a trigger circuit.

The output is, so to speak, triggered back and forth between its two stable states in response to distinctively different input pulses, for example, pulses of opposite polarities.

The foregoing types of circuits are known in the form of vacuum tube circuits, utilizing typically either diodes or triodes. Some of the circuits are also known using semi-conductor diodes.

Transistors have recently come into use as relay devices broadly capable of functions similar to those of electromagnetic relays, vacuum tubes, and other devices which respond to a small input signal to control a larger output signal. Transistor current and potential characteristics are quite different from those of electromagnetic relays and of vacuum tubes, and consequently transistors cannot be directly substituted for those other relay devices in any given circuit. While the ultimate function of such a circuit using one or more transistors may be broadly equivalent to the ultimate function of a vacuum tube circuit, the structures of the two circuits are typically quite different.

Transistors are preferred to vacuum tubes and electromagnetic relays for many circuit applications because of their low power requirements, small space requirements and comparatively rapid response to input signals. Such advantages of transistors are particularly desirable in the case of circuits used in high speed computers, which may require thousands of such relay devices. The advantages to be gained with respect to the power requirements and space requirements from the use of transistors in such apparatus as opposed to vacuum tubes are very obvious.

An object of the invention is to provide a novel switching circuit employing transistors.

Another object of the present invention is to provide novel logical circuits, including And and Or circuits.

Another object of the invention is to provide a novel logical circuit of the "Exclusive Or" type.

Another object of the invention is to provide novel regenerative circuits. A further object is to provide novel regenerative circuits employing transistors.

A further object of the invention is to provide a novel specialized selective Or circuit.

The foregoing and other objects of the invention are attained by connecting a plurality of transistors to an output circuit having an external branch common to all the transistors. The impedances between two corresponding electrodes of each transistor are connected to the common external branch with the same polarity. When these impedances are connected in parallel, separate inputs are provided for each transistor and the circuits may be used as logical circuits. The impedances may alternatively be connected in series, in which case the circuit may have a plurality of inputs or a single input. Where two inputs are provided, the circuit may be used for logical purposes. By suitably connecting the inputs, the circuit with the impedances in series may be made regenerative. If provided with a single input, the circuit serves as a simple trigger circuit. If provided with two inputs, it operates as a specialized selective Or circuit.

Other objects and advantages of the invention will become apparent from a consideration of the following specification and claims, taken together with the accompanying drawings.

*Figs. 1 to 4*

Figure 1:
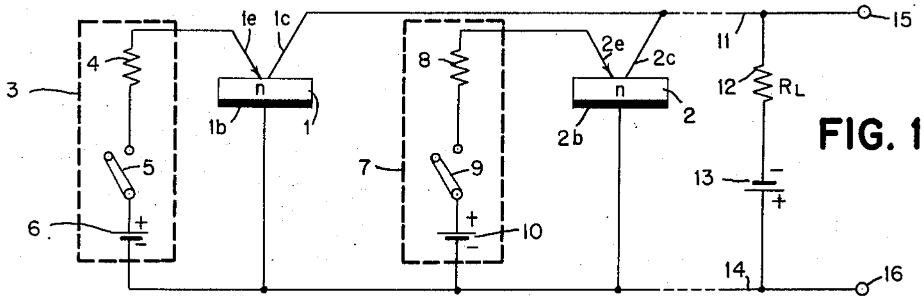
Fig. 1 is a wiring diagram of Or circuit embodying certain features of the invention.

Fig. 1 shows an Or circuit including transistors 1 and 2 respectively having emitter electrodes 1*e* and 2*e*, collector electrodes 1*c* and 2*c* and base electrodes 1*b* and 2*b*.

The transistor 1 has an input circuit branch connected between the emitter electrode 1*e* and the base 1*b*, including an input signal generator or transmitter 3 shown for purposes of illustration as comprising a resistor 4, a single-pole, single-throw switch 5 and a battery 6.

The transistor 2 has a similar input circuit branch connected between emitter 2*e* and base 2*b* and including an input signal generator or transmitter 7 shown for purposes of illustration as including a resistor 8, a single-pole, single-throw switch 9 and a battery 10.

The collector-base impedances of the transistors 1 and 2 are connected in parallel to a common output circuit including a wire 11, a load resistor 12, a battery 13 and a wire 14. Both the collector electrodes 1*c* and 2*c* are connected to the wire 11 and both the base electrodes 1*b* and 2*b* are connected to the wire 14. Connected to the wires 11 and 14 respectively are signal output terminals 15 and 16.

Although only two transistors 1 and 2 are illustrated, it will be readily understood by those skilled in the art that additional transistors, each with its own input signal transmitter, can be connected to the circuit with their respective collector base impedances connected in parallel between the wires 11 and 14.

Figure 2:
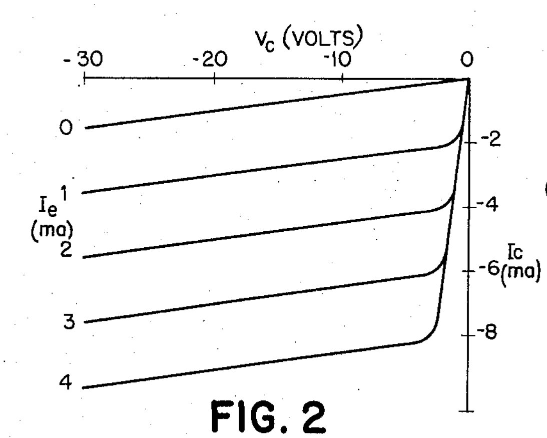
Fig. 2 is a graphical diagram illustrating the output characteristics of one of the transistors in the circuit of Fig. 1.

Fig. 2 shows a family of collector volt-ampere characteristics for one of the transistors of Fig. 1, for example, the transistor 1. Each curve in this family is drawn for a constant value of emitter current I*e*. Five such curves are shown corresponding to emitter currents, of 0, 1, 2, 3 and 4 ma. respectively.

Figure 3:
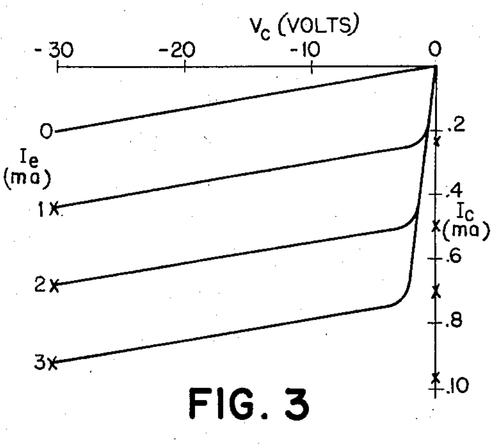
Fig. 3 is a graphical diagram illustrating the output characteristics of another of the transistors used in the circuit of Fig. 1.

Fig. 3 shows a family of collector volt-ampere characteristics for the other transistor of Fig. 1. It should be noted that the values in the family characteristics of Fig. 3 are different from the values in the family of Fig. 2. These two different families of characteristics were selected to show that the circuit of Fig. 1 is not dependent upon the use of carefully matched transistors, but will function properly even though the characteristics of the transistors are somewhat different.

The currents flowing through the collector-base impedances of the transistors 1 and 2 add in the common external branch of the output circuit which extends between the wires 11 and 14, and includes the load resistance 12 and the battery 13 in series. In the input signal transmitters 3 and 7, two input signal conditions are possible for each transistor. In the case of transistor 1, the switch 5 may be open, in which case the emitter current is zero. The other condition is that switch 5 is closed, in which case a current flows from battery 6 through switch 5 and resistor 4 and out through the emitter to the base electrode. The value of this current is determined principally by the battery 6 and resistor 4, which is selected to have an impedance which is very high compared to the impedance between the emitter and base in the forward direction of current flow. For purposes of illustration, the emitter current when the switch 5 is closed may be 3 ma.

Input signal transmitter 7 of transistor 2 similarly has two input conditions; one with the switch 9 open and one with it closed. The emitter current flow with the switch open is of course zero. The emitter current flow with the switch closed may again be taken, for purposes of illustration, as 3 ma.

Figure 4:
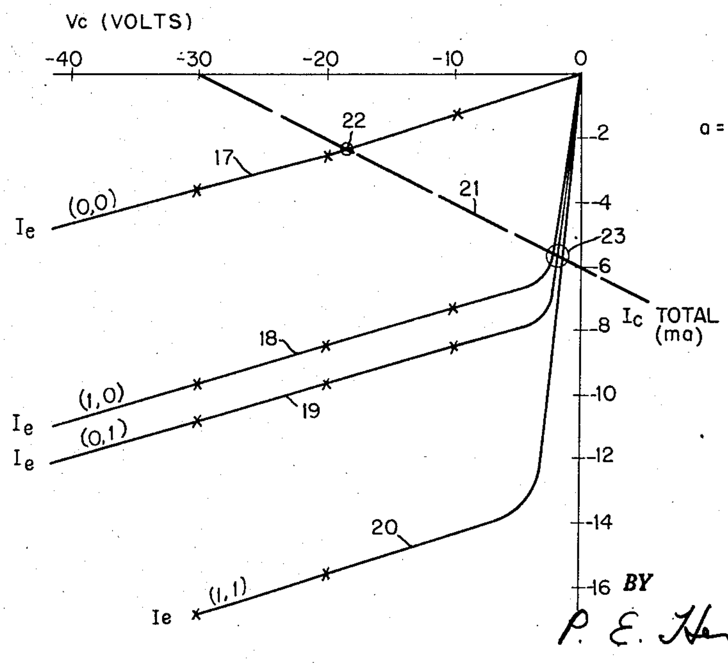
Fig. 4 is a graphical diagram derived from the diagrams of Figs. 2 and 3 and illustrating the output characteristics of the complete circuit of Fig. 1.

Fig. 4 shows a family of composite output characteristics of the circuit of Fig. 1. Each curve represents a particular set of input signal conditions at the transmitters 3 and 7. When both switches 5 and 9 are open, both emitter currents are zero, and the output volt-ampere characteristic is represented by the curve 17 of Fig. 4. Each point on the curve 17 of Fig. 4 represents the sum of the corresponding points for the same collector potential on the zero emitter current curves of Figs. 2 and 3. The current scale in Fig. 4 represents the total current flowing through the external circuit branch, which is the sum of the individual currents flowing through collector-base impedances of the transistors 1 and 2.

When the switch 5 is closed, and the switch 9 is open, the output characteristic is shown by the curve 18 of Fig. 4, which is the sum of the 3 ma. emitter current curve of Fig. 2 and the zero emitter current curve of Fig. 3.

When the switch 9 is closed, and switch 5 is open, the circuit output characteristic is shown by the curve 19 of Fig. 4, which is the sum of the zero emitter current curve of Fig. 2 and the 3 ma. emitter current curve of Fig. 3.

When both the switches 5 and 9 are closed, the output characteristic curve is shown at 20 in Fig. 4. The curve 20 is in the sum of the 3 ma. curves of Figs. 1 and 3.

The curves shown in Figs. 2, 3 and 4 show a feature common to transistors, in that when emitter current flows, as the collector potential approaches zero, the collector current falls off rapidly. The collector is then said to be in a condition of saturation. The load resistance 12 and the potential of battery 13 are selected so that a load line 21, drawn on the family of characteristics of Fig. 4, crosses the curves 18, 19 and 20 at 23, where these curves are closely bunched, in the saturation region of the transistors. However, this load line 21 crosses the curve 17 at a point 22 substantially spaced from the intersections 23 of the load line with the other three composite output characteristic curves. It therefore follows that when both the input signal transmitters 3 and 7 have their switches open, the output potential is in the neighborhood of −18 volts and the current is about −2.5 ma. However, when the input signal transmitters 3 and 7 are in any other combination of conditions, the output potential in the common external branch of the output circuit is in the neighborhood of −2 volts and the current is in the neighborhood of −5.5 ma.

It may therefore be seen that the circuit functions as an Or circuit. When either one or the other or both of the switches 5 and 9 are closed, i.e., when a signal input pulse is applied to one or both inputs, the circuit has an output current and potential of one value, but when both switches 5 and 9 are open, i.e., when no input signal is applied, the output potential has another value. For example, the output voltage at its more positive (i.e., less negative) value of −2 volts may be taken as a positive indication of the closure of one or the other or both of switches 5 and 9, whereas an output potential having the more negative value of −18 volts indicates that neither of the switches is closed.

Alternatively, the circuit may be considered as an And circuit, depending upon the significance attributed to the various input and output signals. For example, an output voltage in the more negative value of −18 volts indicates that both switches 5 and 9 are open, while an output potential at the more positive value of −2 volts indicates that some other combination of conditions exists at the input signal transmitters 3 and 7.

It will be recognized by those skilled in the art that the particular form of input signal transmitter employed is not critical, nor are the specific values of emitter current selected for the two spaced input signal values critical. It is only necessary that after the two emitter current values are selected for the two emitter current signals of each transistor, that the load impedance of resistor 12 and the potential of battery 13 be selected so that the load line 21 crosses the three curves 18, 19 and 20 in a locality 23 where those curves are closely grouped and crosses the curve 17 at a widely separated point 22 providing good discrimination between the two output signal conditions. Since all transistors have saturation regions in their characteristics similar to that described, it is a relatively easy matter to design the resistor 12 and battery 13 to meet these requirements.

Figure 5:
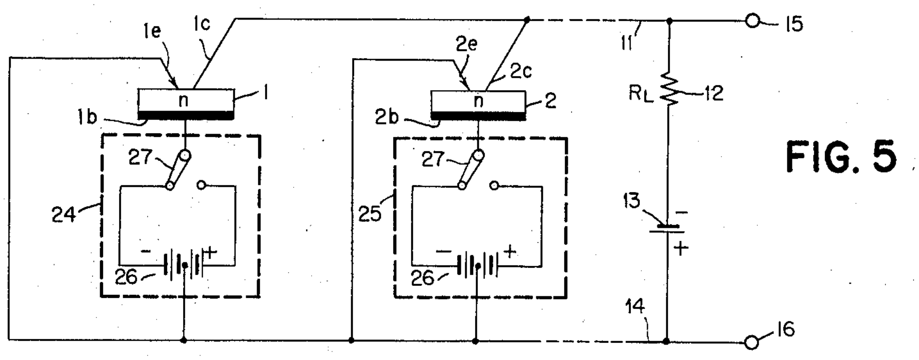
Fig. 5 is a wiring diagram illustrating another Or circuit embodying a modified form of the invention.

*Fig. 5*

Fig. 5 illustrates a modified form of logical circuit which may be used for purposes similar to the circuit of Fig. 1.

The circuit of Fig. 5 includes two transistors 1 and 2 which are illustrated as being identical with the corresponding transistors of Fig. 1, although that is not necessarily the case. Other elements in the circuit of Fig. 2 which are the same as the corresponding elements in the circuit of Fig. 1 have been given corresponding reference numerals and will not be further described. The principal difference in the circuits lies in the input signal generators or transmitters 24 and 25 of Fig. 5, and in the connections of those transmitters and of the base and emitter electrodes.

The emitter electrodes 1*e* and 2*e* are connected directly to the wire 14 which leads to one terminal of the common output circuit branch. The input signal transmitters 24 and 25 are connected between the respective base electrodes 1*b* and 2*b* and the wire 14. Each of the transmitters 24 and 25 comprise a split battery 26 having a center tap connected to the wire 14. Either of the opposite terminals of the battery 26 may be connected through a single-pole, double-throw switch 27 to the base electrode 1*b* or 2*b*, as the case may be. When the switch 27 is in a position engaging the contact connected to the negative terminal of battery 26, as shown, then the emitter electrode is biased positively with respect to the base electrode, and a substantial emitter current flows. When the switch 27 engages the contact connected to the positive terminal of the battery 26, then the emitter is biased negatively with respect to the base, and the emitter current is cut off, or substantially zero. If the positive value of emitter current in each case is taken as 3 ma., then the analysis applied to the circuit of Fig. 1 in the graphs of Figs. 2, 3 and 4 may be applied with equal accuracy to the circuit of Fig. 5. It may therefore be seen that the circuit of Fig. 5 may be utilized as an And circuit, or as an Or circuit, depending upon the significance assigned to the respective positions of the switch 27.

*Figs. 6 to 13*

Figure 6:
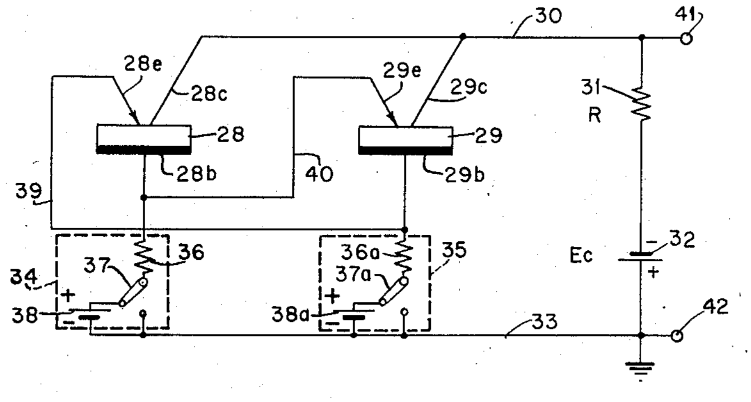
Fig. 6 is a wiring diagram illustrating an Exclusive Or circuit embodying certain features of the invention.

Fig. 6 shows an exclusive Or circuit including two transistors 28 and 29 respectively having emitter electrodes 28*e* and 29*e*, collector electrodes 28*c* and 29*c* and base electrodes 28*b* and 29*b*. Collector electrodes 28*c* and 29*c* are connected in parallel to an output circuit including a wire 30, a load resistance 31, a battery 32, and a wire 33. The base electrode 28*b* of transistor 28 is connected through a signal generator 34 to the wire 33. The base electrode 29*b* of transistor 29 is connected through a similar signal generator 35 to the wire 33. Each of the signal generators 34 and 35 includes a resistor 36, 36*a* and in series with that resistor a single-pole, double-throw switch 37, 37*a* which in one position connects a battery 38, 38*a*, in series with resistor 36, 36*a*, and in its other position connects the resistor 36, 36*a* directly to the wire 33. The emitters, 28*e* and 29*e* are cross connected to the base electrodes 29*b* and 28*b* of the other transistors, respectively. That is, emitter electrode 28*e* is connected through a wire 39 to the base electrode 29*b*. Emitter electrode 29*e* is similarly connected through a wire 40 to the base electrode 28*b*.

Output terminals 41 and 42 are connected to the opposite ends of the common external branch of the output circuit, which branch includes the load resistor 31 and the battery 32.

The operation of the circuit of Fig. 6 will first be explained briefly and then followed by a complete graphical analysis based on Figs. 7 to 13.

Briefly, it may be seen that the signal generators 34 and 35 are connected in series opposition between the base electrodes 28*b* and 29*b*. They are also in series opposition in the connection which may be traced from emitter electrode 29*e* through wire 40 and generators 34 and 35 to base 29*b*, and in the corresponding connection between the emitter electrode 28*e* and base 28*b*. Under these conditions, with both switches closed in their right-hand positions, connecting the resistors 36, 36*a*, directly to wire 33, any potential drops across the resistors 36, 36*a* are in opposition in the respective input circuit branches to the transistors. The emitter electrodes are then substantially at the same potential as their respective bases, so that the emitter current is substantially cut off, and the output current is low.

If one only of the switches 37, 37*a* is now closed in its left-hand position, then the potential of its associated battery biases one of the emitter electrodes positive and the other negative. The one which is biased positive causes a substantial flow of collector current in its transistor, which appears in the common output circuit branch, and hence a signal appears at the output terminals 41, 42.

If both switches 37, 37*a* are closed in their left-hand positions, the potentials of the batteries 38, 38*a* buck each other, and consequently both emitter electrodes remain at the same potential as their respective bases and no output signal is obtained.

Figure 7:
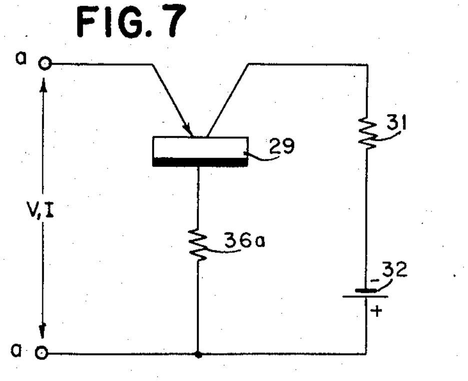
Fig. 7 is a wiring diagram of one of the transistors in Fig. 6, and its associated input and output circuits.

*Fig. 7*

Figures 10, 11:
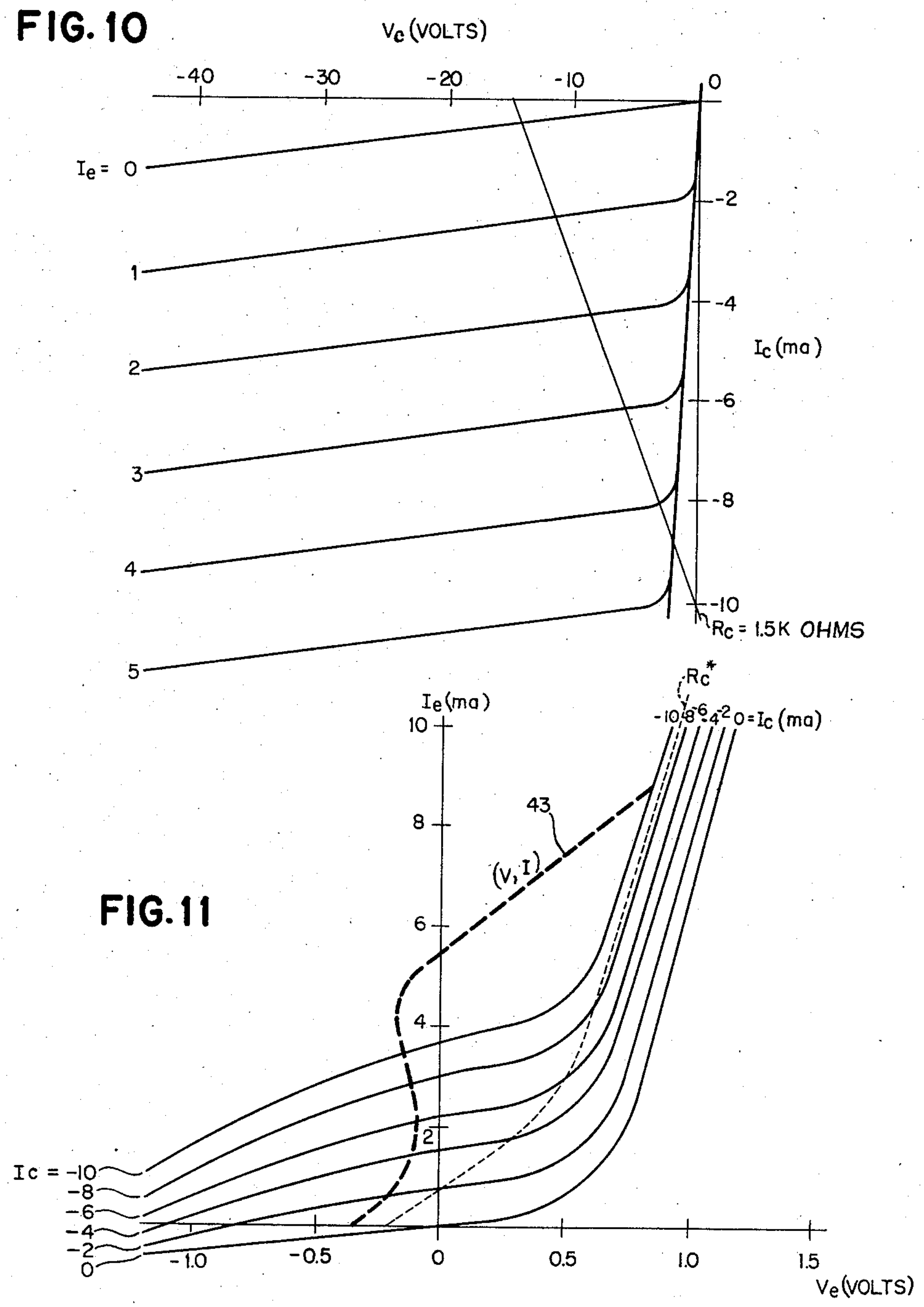
Fig. 10 is a graphical diagram illustrating the output characteristics of one of the transistors of Fig. 6.
Fig. 11 is a graphical diagram illustrating the input characteristics of one transistor of Fig. 6.

Consider now the circuit of Fig. 7, which includes a single transistor, shown as transistor 29 of Fig. 6. Fig. 10 shows a family of collector potential-current ($V_c$, $I_c$) output characteristic curves of the transistor 29. Fig. 11 shows a family of emitter potential-current ($V_e$, $I_e$) input characteristic curves of the transistor 29. Fig. 10 also shows a load line $R_c$, which represents the locus of all the operating points of the transistor 29 when the resistor 31 is connected between its output terminals. The load line $R_c$ has been transferred graphically to Fig. 11, where it is labeled $R_c$*.

Figure 8:
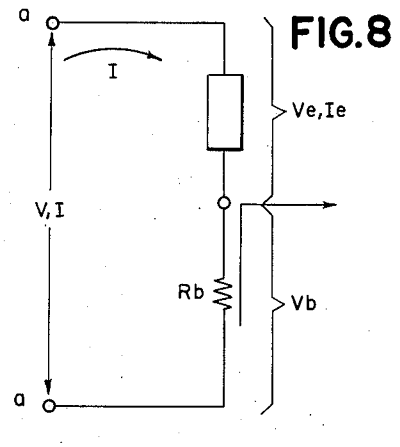
Fig. 8 is a schematic representation of the circuit of Fig. 7 drawn for purposes of analysis.

The characteristics of Figs. 10 and 11 are so-called "grounded base" characteristics. That is, they represent conditions existing when there is no impedance between the base and the positive terminal of battery 32. Note, however, that the circuit of Fig. 7 includes a resistor **36*a* connected in series with the base electrode. The effect of the resistor 36*a*** on the operating points of the transistor is not shown in the characteristics of Figs. 10 and 11 described above. This effect may be determined from the characteristics just described in the following manner. In Fig. 8, the current-potential characteristic of the emitter-to-base impedance alone is represented by the box labeled $V_e$, $I_e$. In Fig. 11, that same characteristic is shown by the dotted line $R_c$*. The potential drop across resistor **36*a*** is the product of its resistance and the algebraic sum of the emitter current and the collector current. If a value of emitter current is assumed, the corresponding values of $V_e$ and $I_c$ may be determined from the intersection in Fig. 11 of that emitter current line with the transferred load line $R_c$*. The collector current and the emitter current being then both known, the potential drop across resistor 36 may be calculated and added algebraically to $V_e$. This yields V which is the voltage a battery across the terminals *a—a* (Fig. 7) must have in order to drive the current I ($I=I_e$) through those terminals. A sequence of points may thus be obtained, which may be plotted on Fig. 11 as the curve 43 (labeled V, I). This curve is reproduced in Fig. 12.

Figure 9:
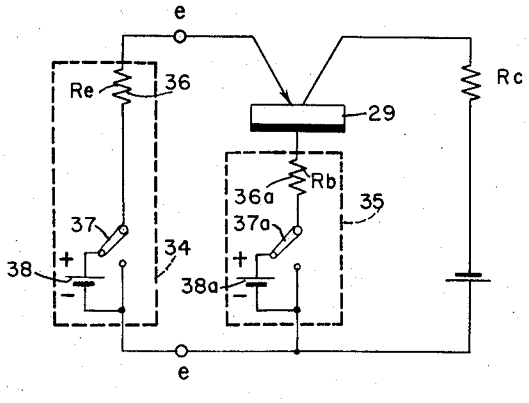
Fig. 9 is a wiring diagram similar to Fig. 7, but somewhat more complete as to the transistor input circuit.
Figure 12:
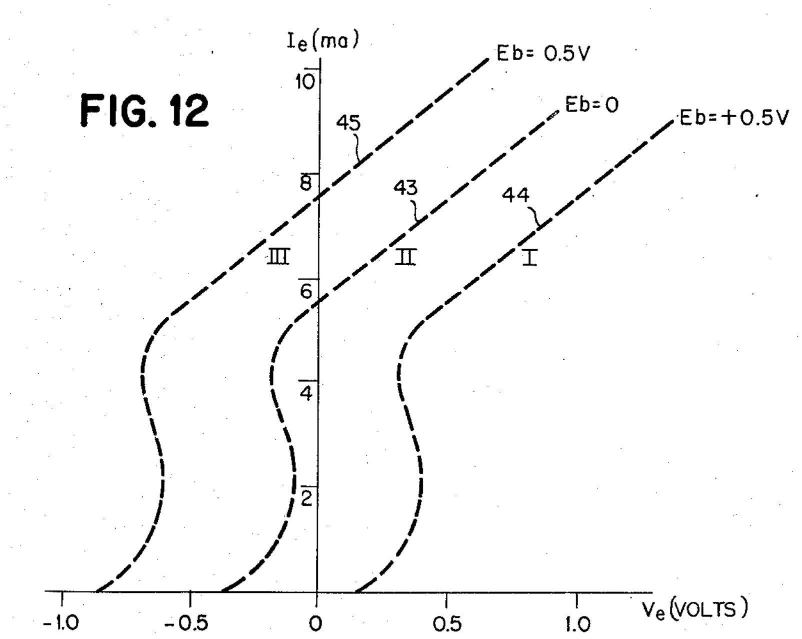
Fig. 12 is a graphical diagram illustrating the effect of varying biasing voltages in the characteristic of Fig. 11.

The insertion of a battery or other source of potential in series with resistor **36*a*, as shown in Fig. 9, results in translating the curve 43 of Fig. 12 along the voltage axis. For example, if a battery having a terminal potential of 0.5 volts is connected in series with resistor with its positive terminal nearest the base, the curve 43 would be shifted to the right where it appears in Fig. 12 as curve 44. If the battery of 0.5 volts had its negative terminal nearest the base, the curve 43 would be shifted to the position of curve 45**.

Figure 13:
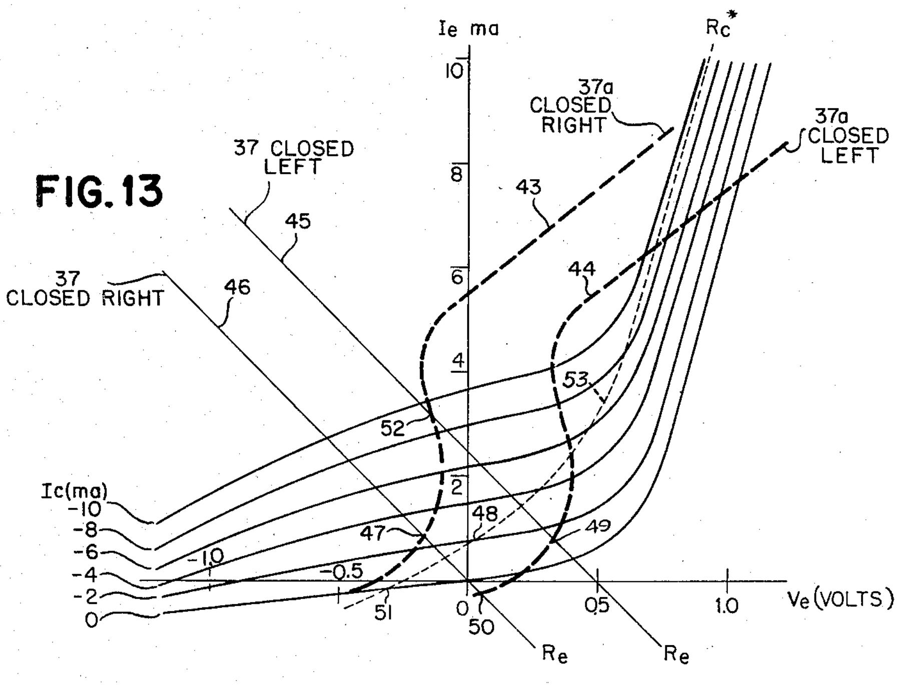
Fig. 13 is a graphical diagram showing the composite characteristic of the complete circuit of Fig. 6.

The circuit of Fig. 9 shows the circuit of Fig. 7 modified by the inclusion of switch **37*a* and battery 38*a* as in Fig. 6, and an additional signal generator 34 having a resistance 36 connected between the emitter and ground. The circuit of Fig. 9 may be said to be the circuit of Fig. 6 with one transistor omitted, so that both signal inputs apply to transistor 29 only. Alternatively, the circuit of Fig. 9 may be said to represent the circuit whose characteristics are drawn in Fig. 12, with another signal input added. The characteristics of the circuit of Fig. 9 are illustrated in Fig. 13. These characteristics will be recognized as the same family of curves which appear in Fig. 11 with the addition of the curves 43 and 44 of Fig. 12 and with the addition of two load lines 45 and 46, representing the two operating conditions of the signal generator 34** of Fig. 9.

Load line 45 represents the locus of all possible operating conditions when the switch 37 of generator 34 is closed in its left-hand position and load line 46 represents the corresponding locus when switch 37 of generator 34 is closed in its right-hand position. Similarly load line 43 represents the locus of all possible operating conditions when the switch **37*a* of generator 35 is closed in its right-hand position, and load line 44 represents the corresponding locus when switch 37*a*** is closed in its left-hand position. These relationships are indicated by suitable legends on Fig. 13.

It may be shown from the characteristics of Fig. 13 that the circuit of Fig. 9 produces an output signal only when the switch 37 of the signal generator 34 is closed in its left-hand position and the switch 37 of the signal generator 35 is closed in its right-hand position.

When the switches 37, **37*a*** of both the signal generators are closed in their right-hand positions, the emitter current and voltage are at the intersection of the curve

46 and the curve 43, namely, the point 47. The collector current is then determined by the point on the transferred load line $R_c$* for the same value of emitter current, namely the point 48 in Fig. 13.

When both switches 37, **37*a* are closed in their left-hand positions, the emitter current and potential for the transistor is determined by the intersection of the curves 44 and 45 in Fig. 13, namely the point 49. The collector current is then at substantially the same value as before, namely the value at the point 48. If the switch 37 of the signal generator 34 is in its right-hand position and switch 37*a* of signal generator 35 is closed in its left-hand position, then the emitter current and potential are determined by the intersection of curves 44 and 46, namely point 50** of Fig. 13. The collector current is the point on the load line $R_c$* for the same value of emitter current, namely the point 51 of Fig. 13.

It may be seen that the collector currents for all three of the operating conditions described above are low. Consider now the fourth possible operating condition, when the switch 37 of signal generator 34 is closed in its left-hand position and the switch 37 of signal generator 35 is closed in its right-hand position. The emitter current and voltage are then determined by intersection of curves 43 and 45, namely the point 52 of Fig. 13. The collector current is determined by the point on the load line $R_c$* for the same value of emitter current, namely the point 53 of Fig. 13. It may be seen that the collector current for this point is more than 8 ma. while the collector current for all the other operating points is less than 3 ma.

When the circuit of Fig. 9 is modified by the addition of a second transistor responsive to the same two signal generators, as shown in Fig. 6, it will readily be understood that the second transistor will produce a substantial output current only when the switch **37*a* of signal generator 35 is closed in its left-hand position and the switch 37** is closed in its right-hand position. Consequently, the circuit will operate as an Exclusive Or circuit, giving an output pulse when one only of the two signal generators supplies an input pulse, but not when both supply pulses and not when neither supplies a pulse.

It should be mentioned that the two transistors employed in Fig. 6 should have substantially identical characteristics.

Figure 14:
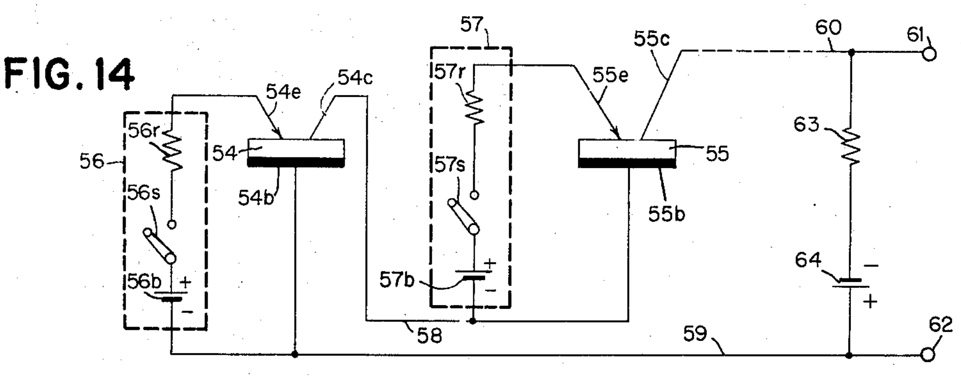
Fig. 14 is a wiring diagram of an And circuit embodying certain features of the invention.
Figure 15:
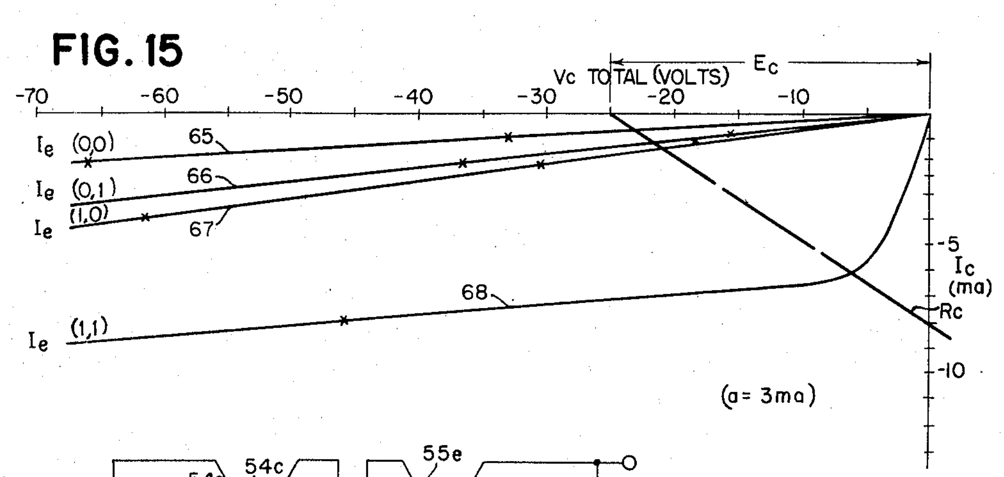
Fig. 15 is a graphical diagram derived from the diagrams of Figs. 2 and 3 and illustrating composite output characteristics of the circuit of Fig. 14.

*Figs. 14 and 15*

Fig. 14 shows a logical circuit connected to give an And operation. This circuit includes two transistors 54 and 55 respectvely having emitter electrodes **54*e*, 55*e*, collector electrodes 54*c* and 55*c* and base electrodes 54*b* and 55*b*. Connected between the emitter electrode and the base electrode of each transistor is a signal generator, shown respectively as generators 56 and 57. Each signal generator is shown, for purposes of illustration, as including a resistance 56*r*, 57*r*, a switch 56*s*, 57*s* and a battery 56*b*, 57*b***.

The collector electrode **54*c* is connected to the base electrode 55*b* through a wire 58. Base electrode 54*b* is connected to a wire 59 which may be grounded and collector electrode 55*c* is connected to a wire 60 which extends to an output terminal 61. Wire 59 is connected to an output terminal 62. An external branch of the output circuit is connected between wires 60 and 59 and includes a resistance 63 and a battery 64**.

While only two transistors are shown in the wiring diagram of this circuit, it will readily be understood that any convenient number of transistors may be connected with their collector and base electrodes in series in the same manner that the corresponding electrodes of the transistors 54 and 55 are connected in series.

Because of this series connection, the collector-base voltages of the transistors in this circuit add algebraically across the external branch of the output circuit.

Fig. 15 shows a composite family of output characteristics for the circuit of Fig. 14. These curves are derived from the curves of Figs. 2 and 3 by taking a single value of collector current and a single value of emitter current, determining from each of the two figures a corresponding collector voltage, adding the two voltages, and plotting the sum against the selected value of collector current in Fig. 15.

Four curves, numbered 65, 66, 67 and 68, appear in Fig. 15. The curve 65 shows the composite output characteristic obtained when both switches **56*s* and 57*s* are open, so that no emitter current flows in either of the transistors. The same collector current must flow through both transistors at all times, since the collectors are connected in series. Consequently, taking a collector current of 1 ma. for example, in Fig. 2 at zero emitter current, a collector voltage of approximately 18 is indicated. In Fig. 3, for the same collector current and emitter current a collector voltage of approximately 16 is indicated. In the composite characteristic of Fig. 15, a point is thereby established for a collector current of 1 ma., and a voltage of 18+16, or 34. Other points may be plotted, which together will define the curve 65**.

The curve 66 represents a similar plot of the addition of the curve in Fig. 2 for 3 ma. emitter current and the curve in Fig. 3 for zero emitter current, corresponding to an operating condition in which switch **56*s* is closed and switch 57*s*** is open.

Curve 67 is another plot adding the curve for 3 ma. in Fig. 2 and a curve for zero ma. in Fig. 3, corresponding to a condition in which switch **56*s* is closed and switch 57*s*** is open.

The curve 68 represents the addition of the curves for 3 ma. emitter current in both Figs. 2 and 3, corresponding to a condition in which switches **56*s* and 57*s*** are both closed.

There is also drawn on Fig. 15 a load line $R_c$, whose position is determined by the voltage of battery 64 when no collector current is flowing and whose slope is determined by the resistor 63. This load line is the locus of all operating points of the circuit of Fig. 14. It may be seen that the operating points represented by the intersections of load line $R_c$ with the curves 65, 66 and 67 are closely grouped, all representing collector currents in the neighborhood of 2 ma. or less and collector voltages between −20 and −25. On the other hand, the operating point represented by the intersection of load line $R_c$ with curve 68 shows a collector current of 6 ma. and a collector voltage of approximately −6. It may therefore be seen that the circuit produces a substantially different output signal when all the signal generators are supplying input signals than it does when any one or both the input signal generators is not supplying an input signal. This is typical And circuit operation, since both one signal generator and the other must be supplying signals in order to get an output signal.

As pointed out in the general discussion of logical circuits above, the circuit of Fig. 14 may be considered as an Or circuit, by simply inverting the meanings associated with the input and output signals. Specifically, a collector voltage of −20 and a collector current of 2 ma. indicates that one or the other or both generators is not supplying a signal.

Figure 16:
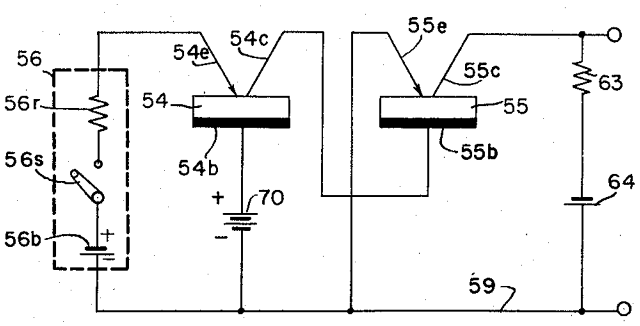
Fig. 16 is a wiring diagram of a trigger circuit embodying certain features of the invention.
Figure 17:
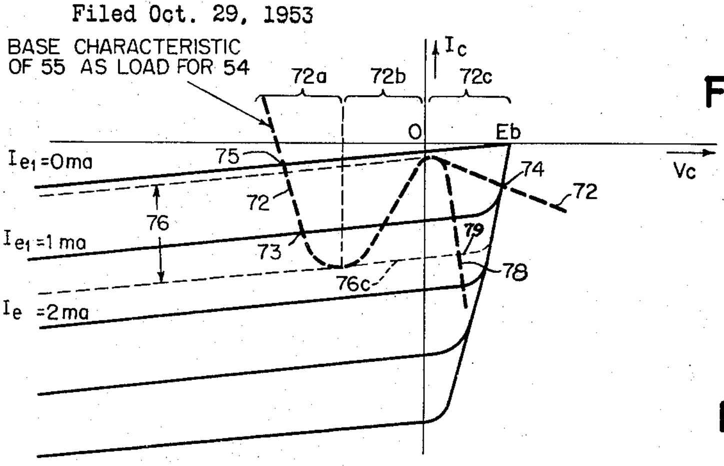
Fig. 17 is a graphical diagram illustrating the output characteristics of one of the transistors of Fig. 16.

*Figs. 16 and 17*

The circuit of Fig. 16 is of the type commonly known as a regenerative or "trigger" circuit. Those elements in Fig. 16 which are common to both Figs. 14 and 16 have been indicated by the same reference numerals, and will not be further described. The principal differences between the two figures are the omission of the signal generator 57, the addition of a battery 70 between base **54*b* and wire 59, and the connection of emitter 55*e* directly to wire 59**.

Fig. 17 shows a family of collector current-potential characteristics for transistor 54, each curve being drawn for a constant value of emitter current. There is superimposed on this family of characteristics a curve 72. Curve 72 is derived from the base current-collector potential characteristic of transistor 55, taken with a grounded emitter, by simply inverting that characteristic about the $V_c$ axis. This inversion is justified by the circuit connections of Fig. 16, since the base potential of transistor 55 is the same as the collector potential of transistor 54, and since the base current of transistor 55 is the negative of the collector current of transistor 54. This curve 72 accurately represents the load on the output of transistor 54. Referring to Fig. 17 it may be seen that curve 72 includes two regions **72*a* and 72*c* of positive slope separated by a region 72*b* of negative slope. The circuit is stable when it is operating either of the regions 72*a* and 72*c*, but is not stable in the region 72*b*. The region 72*a* is characterized by high collector current in transistor 55, and the region 72*c*** is characterized by low collector current.

Starting with an emitter current in transistor 54 of 1 ma., the circuit operates stably at the point 73 in region **72*a*. If the emitter current is now increased, as for example by transmission of a positive signal to the emitter 54*e*, the operating point will move to the right-hand side of the stable region 72*a*, and then will suddenly move into the stable region 72*c* at the point 72 where the curve 72 is intersected by the whole family of characteristics of transistor 54, in the saturation region of those characteristics. If now the emitter current is reduced, as by removing the input signal, the operating point will move to the left along the curve 72 until it comes to the unstable negative resistance region 72*b* and will then move suddenly to the point 75 in the stable region 72*a*. As long as the emitter current is in a range indicated at 76 in Fig. 17, the circuit will operate stably either in the region 72*a* or 72*c*. An emitter current less than that defined by the region 76 will cause the circuit to operate in the region 72*a*, while an emitter current greater than that defined by region 76 will cause operation in the region 72*c*. The circuit is normally operated with a so-called quiescent point in the region 76 and is triggered back and forth between its two output states by applying signals to the emitter of 54 such that the emitter current of 54 becomes greater than or less than the quiescent current by an amount at least slightly in excess of the current excursion designated by region 76**.

Figure 18:
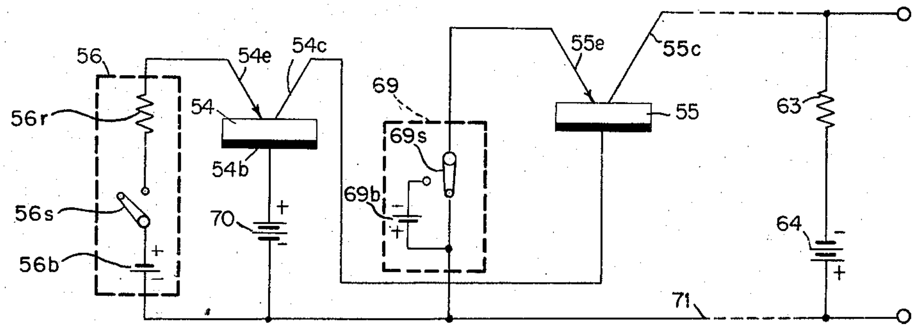
Fig. 18 is a wiring diagram illustrating a specialized selective Or circuit embodying certain features of the invention.

*Fig. 18*

Fig. 18 illustrates a circuit having certain characteristics similar to the circuit of Fig. 14, and other characteristics similar to the circuit of Fig. 16. It may be described as a specialized selective Or circuit. The circuit has two inputs and a single output, which is shiftable between "on" and "off" states. The characteristics of this circuit are such that the output is shifted from the "off" state of conductivity to the "on" state only when an input signal is received from a particular one of the inputs without a signal from the other. It remains in the "on" state as long as the input signal continues from that particular input, whether a signal comes in from the other input or not.

In Fig. 18, circuit elements corresponding to those in Figs. 14 and 16 have been given the same reference numerals and will not be described further in detail. The principal difference between the circuits of Figs. 14 and 18 lies in the signal generator associated with the transistor 55. In Fig. 18, the signal generator 69 is substantially different structurally from the generator 57 of Fig. 14, since it is a low impedance generator, including a switch **69*s* and a battery 69*b*, with substantially no internal impedance. The connections of generator 69 are also different from the connections of generator 57 of Fig. 14, since generator 69 is connected between emitter 55*e* and wire 71. The switch 69*s* of generator 69** is movable between a left-hand, positive signal position in which battery 69*b* is connected between emitter 55*e* and wire 71, and a right-hand, no-signal position in which emitter 55*e* is connected directly to wire 71. Another difference is that a battery 70 is connected in series with the base electrode 54*b* of transistor 54, as in Fig. 16.

The circuit of Fig. 18 is a regenerative circuit, in that a current flowing in the output circuit effectively feeds back a signal to one of the input circuits so as to maintain the output current flowing.

Figures 19, 20:
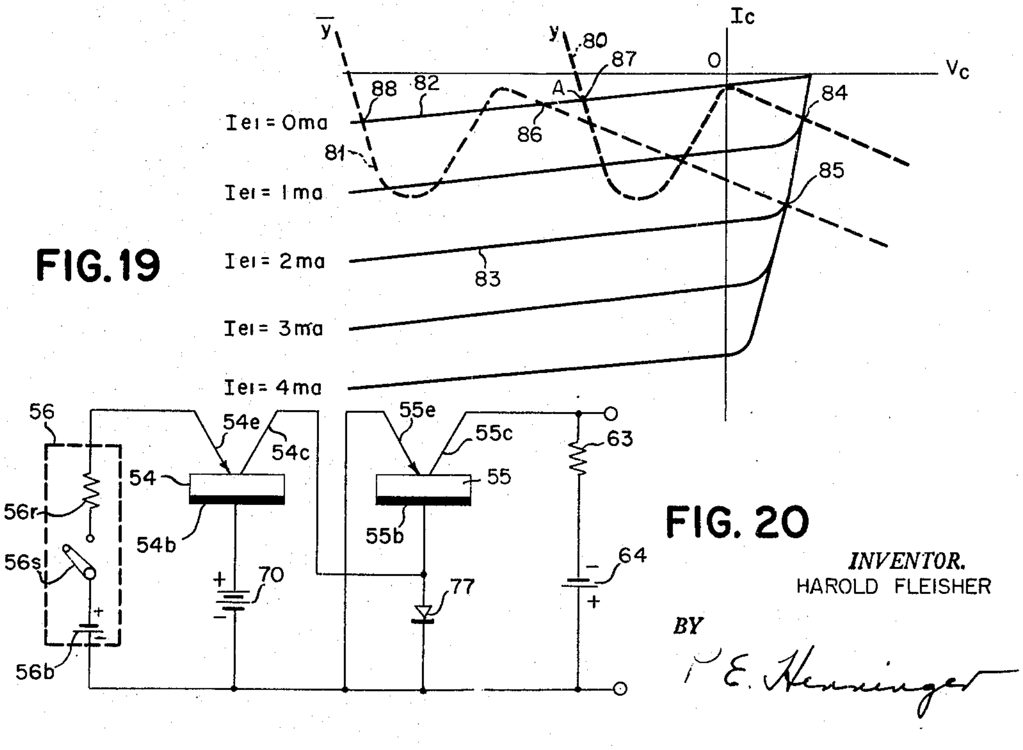
Fig. 19 is a graphical diagram similar to Fig. 17, but showing the corresponding output characteristics as applied to the circuit of Fig. 18.
Fig. 20 is a wiring diagram of a modified form of the trigger circuit of Fig. 16.

*Fig. 19*

This figure illustrates graphically the operation of the circuit of Fig. 18. The family of collector current potential characteristics appearing in Fig. 19 is the same family, i.e., for transistor 54, which appears in Fig. 17. There are superimposed on this family of characteristics in Fig. 19 two load lines 80 and 81. Each of the load lines 80 and 81 represents the transferred base characteristic of the transistor 55 for certain operating conditions. The load line 80 represents the operating conditions which exist when the switch 69*s* is closed in its right-hand position, as shown in the drawing. The load line 81 represents the operating conditions which exist when the switch 69*s* is closed in its left-hand position.

The curve 82, which is the collector current-potential characteristic of transistor 54 for zero emitter current, is the locus of the operating points when the switch 56*s* of signal generator 56 is open. The curve 83, which is the collector current potential characteristic for transistor 54 when the emitter current is 2 ma., is the locus of the operating points when the switch 56*s* is closed.

When the circuit is operating on any point on one of the gently sloping right-hand portions of the curves 80 and 81, the collector current in transistor 55 is low, corresponding to a "no signal" or "off" condition at the output terminals. When the system is operating at a point on one of the more steeply sloped left-hand portions of the curves 80, 81, the collector current of transistor 55 is high, representing a "signal" or "on" condition at the output terminals. (It should be understood that the circuit does not operate stably on the central negatively sloped portions of the curves 80 and 81.)

The normal or initial condition of the circuit is with the switch 56*s* closed and the switch 69*s* closed in its righthand position. The operating point then appears graphically at 84, at the intersection of curves 83 and 80.

If, starting at the normal operation condition, the switch 69*s* is shifted to its left-hand position, then the operating point shifts to 85, the intersection between curve 83 and curve 81. It may be observed that at this point the output terminals of the circuit are still in their "off" condition. If now the switch 56*s* is opened, the operating point moves along the curve 81 to the point 86 where curve 81 intersects curve 82. The output terminals are still in their "off" condition. It may therefore be seen that the circuit may not be shifted from its "off" to its "on" condition if switch 69*s* is operated before switch 56*s*.

Returning again to the normal operating condition with switch 69*s* closed in its right-hand position and switch 56*s* closed, assume now that switch 56*s* is opened, leaving switch 69*s* in its right-hand position. The operating point shifts then from 84 to the point 87 at the intersection of curves 80 and 82. This point is on the steeply sloped "on" portion of the curve 80, so that the circuit now produces an output signal. If the switch 69*s* is now shifted to its left-hand position, the operating point shifts to the point 88 at the intersection of curves 82 and 81. This point 88 is on the steeply sloped "on" portion of the curve 81, so that the circuit continues to produce an output signal.

From the foregoing it should be apparent that the circuit can transfer from an "off" condition to an "on" condition only by opening the switch 56*s* while the switch 69*s* remains closed in its right-hand position.

After the circuit has reached an "on" condition, it will remain in that "on" condition as long as switch 56*s* remains open but will return to an "off" condition as soon as switch 56*s* is closed. Once it has returned to an "off" condition, it can be restored to an "on" condition only by opening the switch 56*s* while switch 69*s* is closed in its right-hand position.

*Fig. 20*

Fig. 20 shows a modified form of the circuit of Fig. 16 in which an asymmetric conductive unit 77 is connected between the base of transistor 55 and ground. The major effect of this modification is to change the slope of the load line in the 72*c* region to a value indicated by the line 78 in Fig. 17.

The principal advantages of using this asymmetric unit 76 are that less collector power is dissipated when the circuit is operating in the 72*c* region, and that a more distinct operating point is provided in that region. In this connection, note that intersection 79, between the curve 78 and the emitter current curve 76*c* is sharper than intersection 74 between curve 72 and curve 76*c*. This represents a substantially more stable and more clearly defined operating condition in the output circuit.

In the various circuits illustrated, I have shown and described specific signal generator structures. My invention is in no way limited to the specific signal generator structures shown and described, but any electrically equivalent signal generator may be used in place thereof.

While the various features of the invention are described above as applied to circuits employing point contact transistors with N-type semi-conductive material, it will readily be recognized by those skilled in the art that the circuits could be modified to secure similar results with P-type semi-conductive material, in many cases by simply reversing the polarities of the potentials. Furthermore, the circuits could be modified to use junction transistors, either of the PNP or NPN types.

I claim as my invention:

1. A logic circuit comprising a plurality of transistors, each having input, output and common electrodes, and each having a family of output characteristics defined by the relation of output electrode current as a first variable with respect to the output electrode-common electrode potential as a second variable, each characteristic of the family corresponding to a different fixed value of input electrode current, said families of characteristics being similar but not necessarily equal for the respective transistors, a plurality of independently operable signal input means, one for each transistor, connected between the input and common electrodes of the respective transistors, each signal input means being shiftable suddenly between separated signal and no-signal current values, first and second output terminals, an output circuit including a load branch circuit and a load driving branch circuit, said load branch circuit including a source of unidirectional electrical energy and a load impedance connected in series between said terminals, said load driving branch circuit including the internal impedances between the common and output electrodes of all the transistors, and means connecting said internal impedances directly and conductively between said terminals without intervening coupling impedances, so that one of said variables always has a common value in all of the transistors and the sum of the other of said variables in all of the transistors appears at said terminals, said transistors having a family of collective output characteristics defined by the relation of said one variable to the sum of the values of the other variable in all the transistors, each of said collective characteristics corresponding to a different combination of signal and no-signal current values in the several signal input means, all of said collective characteristics except one being closely bunched at the intersection therewith of a load line defined by the load impedance in cooperation with the source, and said one characteristic having a substantially different value from the others at its intersection with the load line, so that one combination of signal inputs corresponding to said one characteristic produces an output signal at said terminals separated in terms of the other variable from the output signals produced by the other combinations of signal inputs, whereby said one combination of inputs is logically distinguished from the others.

2. A logic circuit as defined in claim 1, in which said connecting means connects the internal impedances in series, so that the one variable having a common value in all the transistors is the output electrode current, and the sum of the output electrode-common electrode potentials across all the transistors appears at the terminals.

3. A logic circuit as defined in claim 1, in which the connecting means connects the internal impedances in parallel, so that the one variable having a common value in all the transistors is the output electrode-common electrode potential, and the sum of the output electrode currents of all the transistors appears at the terminals.

4. A logic circuit as defined in claim 1, in which said one collective characteristic is determined by the presence of no-signal current values at all the signal input means.

5. A logic circuit as defined in claim 1, in which said one collective characteristic is determined by the presence of signal current values at all the signal input means.

6. A logic circuit as defined in claim 1, in which said input, output and common electrode are respectively emitter, collector and base electrodes.

7. A logic circuit as defined in claim 1, in which said input, output and common electrodes are respectively base, collector and emitter electrodes.

8. A logic circuit as defined in claim 1, in which each said signal input means is the only element electrically connected to its associated input electrode, and the connections between the load driving branch circuit and the load branch circuit at the terminals are the only connections between said banch circuits, whereby there is no feedback between the load impedance and any of the transistors.

References Cited in the file of this patent

UNITED STATES PATENTS

| | | |
|---|---|---|
| 2,594,449 | Kircher | Apr. 29, 1952 |
| 2,627,039 | MacWilliams | Jan. 27, 1953 |
| 2,651,728 | Wood | Sept. 8, 1953 |
| 2,733,304 | Koenig | Jan. 31, 1956 |

FOREIGN PATENTS

| | | |
|---|---|---|
| 172,350 | Great Britain | Dec. 6, 1921 |